(12) United States Patent
Jeong et al.

(10) Patent No.: US 12,468,227 B2
(45) Date of Patent: Nov. 11, 2025

(54) APPARATUS AND METHOD FOR PROCESSING SUBSTRATE

(71) Applicant: SAMSUNG ELECTRONICS CO., LTD., Suwon-si (KR)

(72) Inventors: Ji Hoon Jeong, Seongnam-si (KR); Young-Hoo Kim, Yongin-si (KR); Sang Jine Park, Suwon-si (KR); Ji Hwan Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 852 days.

(21) Appl. No.: 17/703,264

(22) Filed: Mar. 24, 2022

(65) Prior Publication Data

US 2023/0052006 A1 Feb. 16, 2023

(30) Foreign Application Priority Data

Aug. 12, 2021 (KR) .................. 10-2021-0106430

(51) Int. Cl.
  *G03F 7/32* (2006.01)
  *F26B 5/00* (2006.01)
  (Continued)

(52) U.S. Cl.
  CPC .............. *G03F 7/32* (2013.01); *F26B 5/005* (2013.01); *F26B 21/12* (2013.01); *F26B 21/14* (2013.01);
  (Continued)

(58) Field of Classification Search
  CPC .......... F26B 21/06; F26B 21/12; F26B 21/14; F26B 5/005; H01L 21/0274;
  (Continued)

(56) References Cited

U.S. PATENT DOCUMENTS 6,358,673 B1   3/2002   Namatsu
6,920,703 B2   7/2005   Taktsu et al.
(Continued)

FOREIGN PATENT DOCUMENTS

JP   2020-126974 A   8/2020
JP   10-2020-0137118 A   12/2020
(Continued)

OTHER PUBLICATIONS

Translation, KR-20180006716-A (Year: 2018).*

*Primary Examiner* — Jessica Yuen
(74) *Attorney, Agent, or Firm* — Sughrue Mion, PLLC

(57) ABSTRACT

An apparatus for processing a substrate includes a process chamber; a support which is placed inside the process chamber and supports the substrate; a fluid supplier which supplies fluid into the process chamber; and a controller configured to perform a compressing step to bring the fluid into a supercritical phase inside the process chamber, in which the compressing step includes a continuous first section and second section, the fluid supplier includes a first portion and a second portion, and the controller supplies the fluid into the process chamber at a first speed during the first section using the first portion, and supplies the fluid into the process chamber at a second speed higher than the first speed during the second section using the second portion.

19 Claims, 8 Drawing Sheets

(51) Int. Cl.
   *F26B 21/12* (2006.01)
   *F26B 21/14* (2006.01)
   *H01L 21/027* (2006.01)
   *H01L 21/67* (2006.01)

(52) U.S. Cl.
   CPC .... *H01L 21/0274* (2013.01); *H01L 21/67028* (2013.01)

(58) Field of Classification Search
   CPC .......... H01L 21/67028; H01L 21/6875; H01L 21/67034; H01L 21/02057; G03F 7/32; G03F 7/325; G03F 7/427
   See application file for complete search history.

(56) References Cited

U.S. PATENT DOCUMENTS

| | | |
|---|---|---|
| 10,576,493 B2 | 3/2020 | Egashira et al. |
| 2018/0366348 A1* | 12/2018 | Cho ................. H01L 21/67173 |
| 2021/0023582 A1 | 1/2021 | Heo et al. |
| 2021/0072644 A1 | 3/2021 | Choi et al. |
| 2021/0159095 A1* | 5/2021 | Ihara ................. H01L 21/02101 |

FOREIGN PATENT DOCUMENTS

| KR | 10-2009-0035947 A | 4/2009 |
|---|---|---|
| KR | 10-2019-0109328 A | 9/2009 |
| KR | 10-2017-0006570 A | 1/2017 |
| KR | 20180006716 A * | 1/2018 |

* cited by examiner

APPARATUS AND METHOD FOR PROCESSING SUBSTRATE

CROSS-REFERENCE TO RELATED APPLICATION

This application is based on and claims priority under 35 U.S.C. § 119 to Korean Patent Application No. 10-2021-0106430 filed on Aug. 12, 2021 in the Korean Intellectual Property Office, the disclosure of which is incorporated by reference herein in its entirety.

BACKGROUND

1. Field

The disclosure relates to an apparatus and a method for processing a substrate.

2. Description of Related Art

When fabricating a semiconductor device or a display device, various processes such as photographing, etching, ashing, ion implantation, thin film deposition, and cleaning are performed. Here, the photographic process includes coating, exposing, and developing processes. A photosensitive liquid is applied onto a substrate (that is, a coating process), a circuit pattern is exposed on a substrate on which a photosensitive film is formed (that is, an exposure process), and an exposed region of the substrate is selectively developed (that is, a developing process). After that, a developer used in the developing process needs to be removed from the substrate.

SUMMARY

On the other hand, a supercritical fluid may be used when removing (or drying) the developer. For example, the substrate is settled inside a process chamber and fluid is supplied from a back side of the substrate to compress the inside of the process chamber. Accordingly, the fluid is brought into a supercritical phase inside the process chamber, and the fluid of the supercritical phase is mixed with the developer. The developer and the fluid mixed with each other are exhausted to the outside of the process chamber.

Aspects of the disclosure provide an apparatus for processing the substrate capable of minimizing a pattern leaning phenomenon or an occurrence of particle.

Aspects of the disclosure also provide a method for processing the substrate capable of minimizing a pattern leaning phenomenon or an occurrence of particle.

However, aspects of the disclosure are not restricted to those set forth herein. The above and other aspects of the disclosure will become more apparent to one of ordinary skill in the art to which the disclosure pertains by referencing the detailed description of the disclosure given below.

In accordance with an aspect of the disclosure, an apparatus for processing a substrate includes a process chamber; a support which is placed inside the process chamber and supports the substrate; a fluid supplier which supplies fluid into the process chamber; and a controller configured to perform a compressing step of the processing of the substrate to bring the fluid into a supercritical phase inside the process chamber, wherein the compressing step includes a continuous first section and a second section, wherein the fluid supplier includes a first portion and a second portion, and wherein the controller is further configured to control the fluid supplier to supply the fluid into the process chamber at a first rate during the first section using the first portion, and supply the fluid into the process chamber at a second rate higher than the first rate during the second section using the second portion.

In accordance with an aspect of the disclosure, an apparatus for processing a substrate includes a process chamber; a support which is placed inside the process chamber and supports the substrate; a fluid supplier which supplies fluid toward an upper side of the substrate inside the process chamber; and a controller configured to perform a compressing step of the processing of the substrate to bring the fluid into a supercritical phase inside the process chamber, wherein the compressing step includes a continuous first section, a second section and a third section, wherein the fluid supplier includes a first portion, a second portion, and a third portion, wherein the controller is further configured to control the fluid supplier to supply the fluid into the process chamber at a first rate during the first section using the first portion, supply the fluid into the process chamber at a second rate higher than the first rate during the second section using the second portion, and supply the fluid into the process chamber at a third rate higher than the second rate during the third section using the third portion, wherein a progress time of the first section is equal to or greater than $\frac{1}{10}$ or more and equal to or smaller than $\frac{1}{15}$ of a progress time of the compressing step, and wherein the first rate is equal to or greater than 0.1 g/s and equal to or smaller than 0.5 g/s.

In accordance with an aspect of the disclosure, A method for processing a substrate includes a compressing step of supplying a fluid into a process chamber to bring the fluid into a supercritical phase inside the process chamber; a processing step of processing the substrate inside the process chamber, using the fluid of the supercritical phase; and a decompressing step of exhausting the fluid inside the process chamber, wherein the compressing step includes a continuous first section and a second section, and includes supplying the fluid into the process chamber at a first rate during the first section, and supplying the fluid into the process chamber at a second rate higher than the first rate during the second section.

Specific matters of other embodiments are included in the detailed description and drawings.

BRIEF DESCRIPTION OF DRAWINGS

The above and other aspects and features of certain embodiments of the disclosure will be more apparent from the following description taken in conjunction with the accompanying drawings, in which.

DETAILED DESCRIPTION OF EMBODIMENTS

Figure 1:
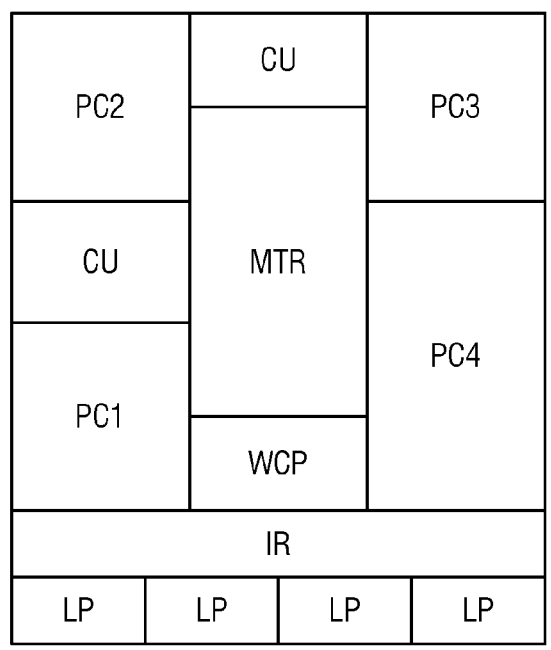
FIG. 1 is a plan view for explaining a substrate processing system to which an apparatus for processing a substrate according to an embodiment is applied.

Hereinafter, embodiments of the disclosure will be described in detail referring to the accompanying drawings. All of the embodiments disclosed herein are example embodiments, and thus, the disclosure is not limited thereto and may be realized in various other forms. The same reference numerals are used for the same components on the drawings, and repeated descriptions thereof will not be provided.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

At least one of the components, elements, modules or units (collectively "components" in this paragraph) represented by a block in the drawings may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

FIG. 1 is a plan view for explaining a substrate processing system to which an apparatus for processing the substrate is applied according to an embodiment.

Referring to FIG. 1, the substrate processing system includes a plurality of load ports LP, an index robot IR, a cooling processing module WCP, a transfer robot MTR, a controller CU, a plurality of process modules PC1 to PC4, and the like.

A container in which a substrate W is accommodated is placed in the load port LP. Although a front opening unified pod (FOUP) may be used as the container, the container is not limited thereto. The container may be carried into the load port LP from the outside by an overhead transfer (OHT) or may be carried out from the load port LP to the outside.

Here, the substrate W may be in a state in which an exposed photosensitive film is formed. For example, the photosensitive film may be a negative tone develop (NTD) or a positive tone develop (PTD), or may be a chemically amplified resist (CAR) or a non-chemically amplified resist (Non-CAR).

The index robot IR delivers the substrate W between the container placed in the load port LP and the cooling processing module WCP. The index robot IR is placed on the rail and may move in a direction in which a plurality of load ports LP are arranged.

The cooling processing module WCP is a space in which the substrate W temporarily stays between the load port LP and the process modules PC1 to PC4 (that is, serves as a buffer). Further, the cooling processing module WCP adjusts the temperature of the substrate W. That is, the temperature of the substrate W delivered by the index robot IR or the temperature of the substrate W processed by the process modules PC1 to PC4 may be adjusted to a preset value.

The transfer robot MTR may draw out the substrate W placed on the cooling processing module WCP and transfer it to a preset process module (e.g., PC1) among the plurality of process modules PC1 to PC4. Further, the transfer robot MTR may be conveyed from any one (e.g., PC1) of the plurality of process modules PC1 to PC4 to another process module (e.g., PC2).

The plurality of process modules PC1 to PC4 may be placed in a single row, may be placed to be stacked vertically, or may be placed in a combined form thereof. As shown, some process modules PC1 and PC2 and some other process modules PC3 and PC4 may be placed on both sides of the transfer robot MTR. The arrangement of the plurality of process modules PC1 to PC4 is not limited to the above example, and may be changed in consideration of the footprint of the apparatus for processing the substrate and the process efficiency.

For example, the process module PC1 is a developing processing chamber, and is a region in which the substrate W formed with the exposed photosensitive film is developed with a developer (e.g., n-butyl acetate (nBA)). When n-butyl acetate is used as the developer, the photosensitive film may be a negative tone develop (NTD).

The process modules PC2 and PC3 are supercritical processing chambers (or high-pressure fluid processing chambers), and are regions in which the developer remaining (that is, wetted) on the substrate W developed by the process module PC1 is removed using the supercritical fluid. The supercritical fluid may be, but is not limited to, carbon dioxide. The supercritical fluid to be used may vary depending on the type of remaining developer. The structure and operation of the process modules PC2 and PC3 will be specifically described later referring to FIGS. 2 to 11.

The process module PC4 is a bake chamber, and is a region which bakes the substrate W from which the developer has been removed by the process module PC2 or PC3.

The controller CU generally controls the operations of the index robot IR, the cooling processing module WCP, the transfer robot MTR, and a large number of process modules PC1 to PC4.

Figure 2:
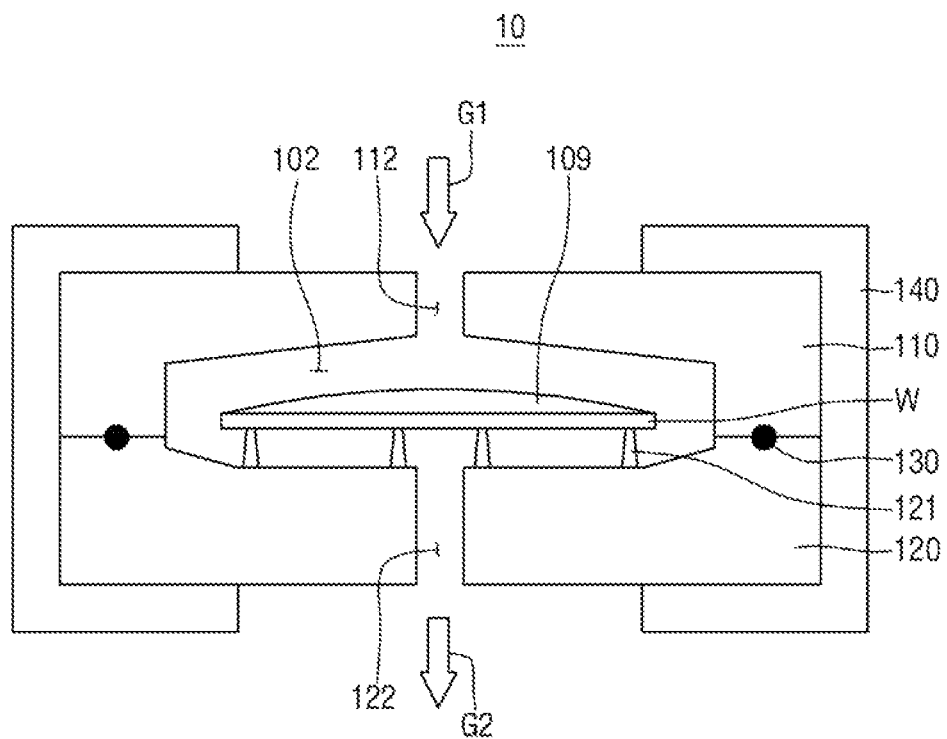
FIG. 2 is a diagram for explaining a structure of a process module of FIG. 1.

FIG. 2 is a diagram for explaining the structure of a process module (e.g., PC2) of FIG. 1.

Referring to FIG. 2, the process module (e.g., process chamber 10) includes an upper housing 110, a lower housing 120, a support pin 121, a sealing member 130, a clamping member 140, and the like.

A first cavity is formed on a lower side of the upper housing 110, a second cavity is formed on an upper side of the lower housing 120, and the first cavity and the second cavity are connected to each other to form a processing space 102 inside. The plurality of support pins 121 may be placed in the second cavity of the lower housing 120.

The upper housing 110 is formed with a supply hole 112 for supplying a fluid to the processing space 102 (see reference numeral G1). As shown, the supply hole 112 may be placed, but is not limited to being placed, at the center (e.g., a center region) of the upper housing 110 (or the center of the upper side of the substrate W).

The lower housing 120 is formed with an exhaust hole 122 for exhausting the fluid from the processing space 102 (see reference numeral G2). As shown, the exhaust hole 122 may be placed at the center (e.g., a center region) of the lower housing 120 (or the center of the lower side of the substrate W), but is not limited thereto.

The sealing member 130 is placed between the upper housing 110 and the lower housing 120 so that the processing space 102 may be maintained at a high pressure. The sealing member 130 may be, for example, an O-ring.

The clamping member 140 serves to secure the upper housing 110 and the lower housing 120 so that the upper housing 110 and the lower housing 120 do not spread out from each other, while performing the high pressure process.

Here, the operation of the process module 10 will be described. The upper housing 110 and/or the lower housing 120 may be moved up and down. The substrate W is settled on the support pin 121 of the lower housing 120 in a state in which the upper housing 110 and the lower housing 120 are spaced apart from each other. A developer 109 may remain on the substrate W. After the substrate W is settled, the upper housing 110 descends downward or the lower housing 120 ascends upward, and the upper housing 110 and the lower housing 120 are engaged with each other and sealed. The clamping member 140 is then coupled to the upper housing 110 and the lower housing 120. Subsequently, the fluid is supplied to the processing space 102 through the supply hole 112 of the upper housing 110 (see reference numeral G1). The process of supplying the fluid to the processing space 102 will be described later using FIGS. 4 to 6.

Figure 3:
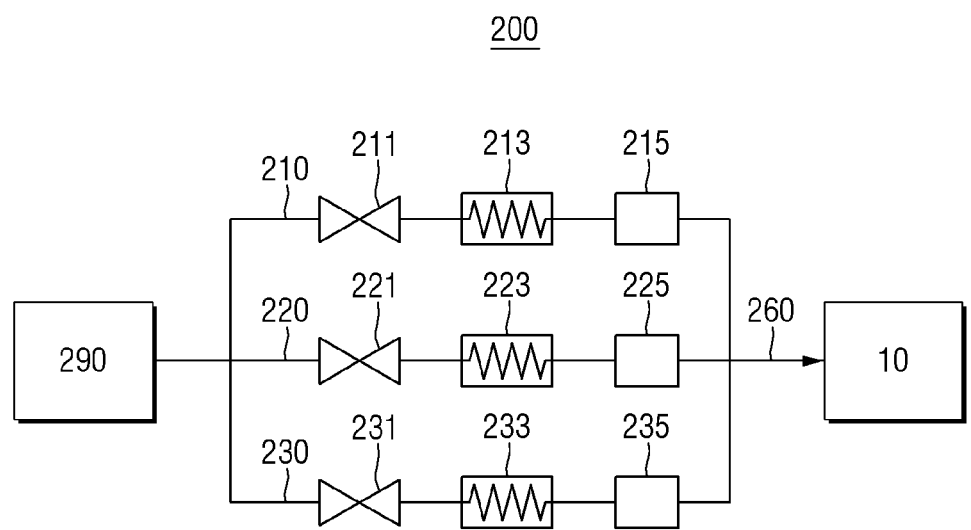
FIG. 3 is a diagram for explaining an example of a fluid supplier that supplies fluid to the process module of FIG. 2.

FIG. 3 is a diagram for explaining an example of a fluid supplier for supplying a fluid to the process module 10 of FIG. 2.

Referring to FIG. 3, a fluid supplier 200 includes a storage tank 290, a main supply line 260, a plurality of supply lines 210, 220 and 230, a plurality of valves 211, 221 and 231, a plurality of heaters 213, 223 and 233, a plurality of filters 215, 225 and 235, and the like.

A main supply line 260 is connected to the process module 10. The fluid is supplied into the processing space 102 through the main supply line 260 and the supply hole (see 112 of FIG. 2).

The fluid stored in the storage tank 290 may be in the supercritical phase.

A plurality of supply lines 210, 220 and 230 are placed in parallel between the storage tank 290 and the main supply line 260.

The plurality of supply lines 210, 220 and 230 include a first supply line 210, a second supply line 220, and a third supply line 230 as shown e.g., in FIG. 3. Although a case where the plurality of three supply lines 210, 220 and 230 are provided are described, the disclosure is not limited thereto. For example, four or more supply lines may be provided.

A first valve 211, a first heater 213, and a first filter 215 are placed on the first supply line 210 (e.g., a first portion). A second valve 221, a second heater 223 and a second filter 225 are placed on the second supply line 220 (e.g., a second portion). A third valve 231, a third heater 233 and a third filter 235 are placed on the third supply line 230 (e.g., a third portion).

Each of the valves 211, 221 and 231 determines whether the corresponding supply lines 210, 220 and 230 are used. For example, when valve 211 is turned on, fluid is delivered to the main supply line 260 through the corresponding supply line 210. The plurality of supply lines 210, 220 and 230 may be selectively used in each process (e.g., section) of a method for processing the substrate to be described later.

Each of the heaters 213, 223, and 233 controls the temperature of the fluid passing through the corresponding supply lines 210, 220 and 230, and each of the filters 215, 225 and 235 removes the impurities of the fluid passing through the corresponding supply lines 210, 220 and 230. As shown, the filter may be installed on the supply lines 210, 220 and 230. As an example, the filter may be provided on the main supply line 260, but not the supply lines 210, 220 and 230.

Figure 4:
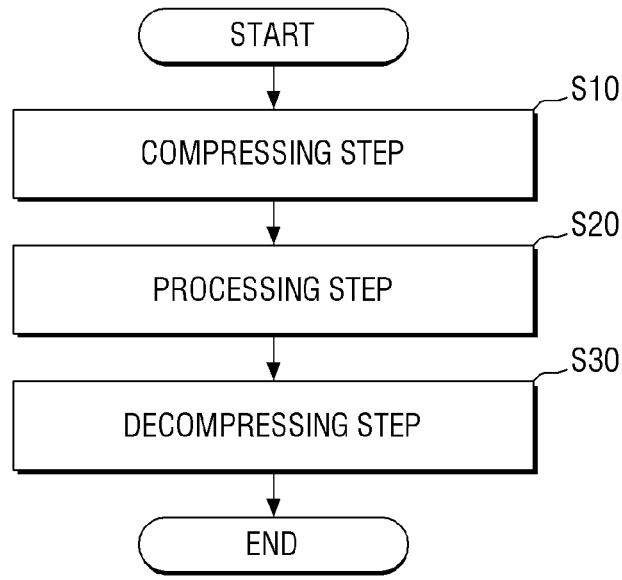
FIG. 4 is a flowchart for explaining a method for processing the substrate according to an embodiment.
Figure 5:
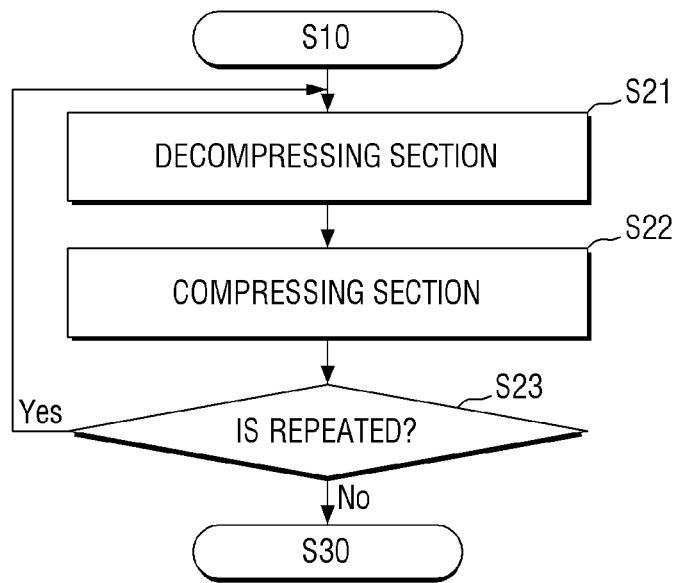
FIG. 5 is a flowchart for explaining step S20 of FIG. 4.
Figure 6:
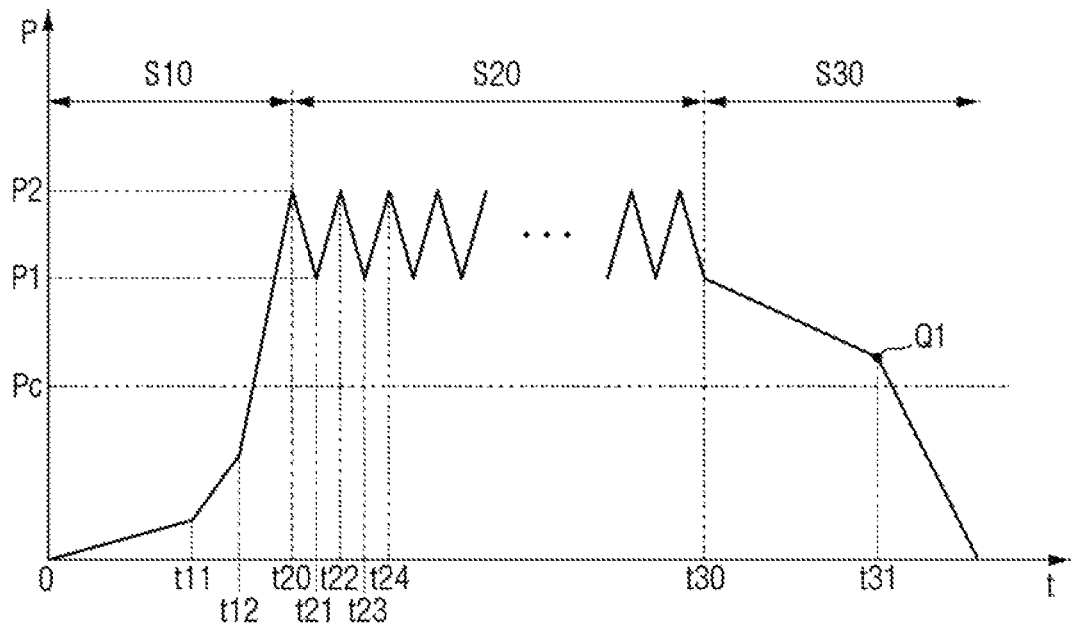
FIG. 6 is a diagram for explaining a pressure change with time corresponding to the method for processing the substrate of FIG. 4.

FIG. 4 is a flowchart for explaining the method for processing a substrate according to an embodiment. FIG. 5 is a flowchart for explaining step (S20) of FIG. 4. FIG. 6 is a diagram for explaining a pressure change with time corresponding to the method for processing the substrate of FIG. 4.

First, referring to FIGS. 4 and 6, the method for processing the substrate includes a compressing step (S10), a processing step (S20), and a decompressing step (S30).

When the substrate W is carried into the processing space 102, the compressing step (S10) is performed.

Specifically, the fluid supplier (200 of FIG. 3) supplies fluid into the processing space 102 to compress the processing space 102. Compression is performed so that the fluid is brought into a supercritical phase inside the processing space 102. The fluid may be, for example, but is not limited to, carbon dioxide. The fluid may be supplied toward the upper side of the substrate W through the supply hole (see 112 of FIG. 2) of the upper housing (see 110 of FIG. 2).

As shown in FIG. 6, the compressing step (S10) may include a plurality of continuous sections. The plurality of sections include a first section (0 to t11), a second section (t11 to t12), and a third section (t12 to t20).

The fluid supplier (200 of FIG. 3) supplies fluid into the processing space 102 at a first rate during the first section (0 to t11), and supplies fluid into the processing space 102 at a second rate higher than the first rate during the second section (t11 to t12).

As described above, the fluid may be supplied toward the upper side of the substrate W (that is, the center of the substrate W corresponding to the supply hole 112) through the supply hole 112 of the upper housing 110. The high-pressure fluid may destroy the pattern formed at the center of the substrate W. Alternatively, since a large amount of fluid may rapidly dry the pattern formed at the center of the substrate W, particles may be caused accordingly. The supplied fluid may need to evenly have an effect on the entire substrate W, without rapidly having an effect only on the pattern formed at the center of the substrate W.

To this end, in the start section (that is, the first section (0 to t11)) of the compressing step (S10), the fluid is supplied at a relatively slow first rate. When the fluid is slowly supplied, the fluid does not destroy the pattern formed at the center of the substrate W and does not dry the pattern formed at the center of the substrate W unnecessarily quickly.

For example, the first rate may be 0.1 g/s to 0.5 g/s (that is, equal to or greater than 0.1 g/s, and equal to or smaller than or 0.5 g/s). If the first rate is smaller than 0.1 g/s, since the fluid is supplied too slowly, the overall process time unnecessarily increases, and the efficiency of the process is degraded. On the other hand, if the first rate is greater than 0.5 g/s, since the fluid is supplied too rapidly, the above-mentioned phenomenon (a pattern leaning phenomenon, etc.) may occur.

The second rate may be 0.5 g/s to 2 g/s.

Further, since the fluid is supplied at the first rate in the first section (0 to t11), the progress time of the first section (e.g., from 0 to t11) may be longer than that of the other sections (e.g., the second section from t11 to t12).

For example, the progress time of the first section (0 to t11) may be 10 to 30 seconds, and the progress time of the second section (t11 to t12) may be 3 to 10 seconds.

For example, the progress time of the first section (0 to t11) is equal to or greater than $1/15$ and equal to or smaller than $1/10$ of the progress time of the entire compressing step (S10), and the progress time of the second section (t11 to t12) may be greater than $1/20$ and smaller than $1/15$ of the progress time of the entire compressing step (S10).

If the progress time of the first section (0 to t11) is smaller than $1/15$ of the progress time of the compressing step (S10), the fluid does not sufficiently spread on the substrate W during the first section (0 to t11), and particles and the like may occur accordingly. If the progress time of the first section (0 to t11) is greater than $1/10$ of the progress time of the compressing step (S10), the overall process time unnecessarily increases, and the efficiency of the process is degraded.

Next, during the third section (t12 to t20), the fluid supplier 200 may supply the fluid into the processing space 102 at a third rate higher than the second rate. The third rate may be 2 g/s to 10 g/s. The fluid supplier 200 continues to supply the fluid during the third section (t12 to t20), and the pressure of the processing space 102 may be increased to a critical pressure Pc or higher. The critical pressure Pc is a pressure that may change the fluid into a supercritical phase. Further, the fluid supplier 200 may increase the pressure of the processing space 102 to a target pressure P2 during the third section (t12 to t20). The target pressure P2 may be from 80 bar to 150 bar.

Subsequently, when the pressure of the processing space 102 reaches the target pressure P2, the processing step (S20) is performed.

Specifically, as shown in FIG. 5, the processing step (S20) includes a plurality of repeated decompressing sections S21 and a plurality of compressing sections S22. In the decompressing section S21, a part of the fluid in the processing space 102 is exhausted through the exhaust hole 122 of the lower housing 120. The pressure of the processing space 102 may be lowered to P1 in the decompressing section S21. The pressure P1 may be from 75 bar to 90 bar. In the compressing section S22, the fluid supplier (200 of FIG. 3) supplies the fluid into the processing space 102 through the supply hole 112 of the upper housing 110. In the compressing section S22, the fluid supplier 200 may supply the fluid into the processing space 102 at a rate of 5 g/s to 10 g/s. The pressure of the processing space 102 in the compressing section S2 may rise again to the target pressure P2. The target pressure P2 may be from 80 bar to 150 bar. If the process is not performed a preset number of times, the process returns to the decompressing section S21 again. If the process is performed a preset number of times, the process proceeds to the decompressing step (S30).

In this way, the developer is mixed with the fluid of the supercritical phase while the plurality of decompressing sections S21 and the plurality of compressing sections S22 are repeated. The developer and fluid mixed with each other are exhausted from the process chamber.

Subsequently, after the processing of the substrate W is completed, the decompressing step (S30) for exhausting the fluid inside the process chamber 10 is performed.

The decompressing step (S30) includes a continuous first exhaust section (t30 to t31) and a second exhaust section (after t31).

The exhaust unit exhausts the fluid from the process chamber 10 at a first exhaust speed during the first exhaust section (t30 and t31), and exhausts the fluid from the chamber 10 at a second exhaust speed higher than the first exhaust speed during the second exhaust section (after t31). When the fluid of the supercritical state is rapidly exhausted from the start section of the decompressing step (S30) (that is, the first exhaust section (t30 to t31)), particles may occur due to a sudden phase change. Therefore, the fluid is slowly exhausted during the start section of the decompressing step (S30) (that is, the first exhaust section (t30 to t31)), and the fluid is rapidly exhausted during the subsequent section (that is, the second exhaust section (after t31)).

Further, at the start time Q1 of the second exhaust section (after t31), the fluid may be in the supercritical phase. At the start time Q1, the pressure of the processing space 102 may be equal to or greater than the critical pressure Pc. At the start time Q1, the pressure of the processing space 102 may be from 75 bar to 90 bar.

In the decompressing step (S30), the decompression is performed until the pressure in the processing space 102 becomes a normal pressure or a similar pressure. When the decompressing step (S30) is completed, the process chamber is opened and the substrate W is carried out from the processing space 102.

Here, referring to FIGS. 3 and 6, from among the plurality of supply lines 210 to 230, the supply lines used during each of the sections (0 to t11, t11 to t12, and t12 to t20) in the compressing step (S10) may differ from each other.

For example, the first supply line 210 may be used during the first section (0 to t11), the second supply line 220 may be used during the second section (t11 to t12), and the third supply line 230 may be used during the third section (t12 and t20).

A first diameter of the first supply line 210 and a second diameter of the second supply line 220 may be different from each other. Further, a third diameter of the third supply line 230 may also be different from those of the first supply line 210 and the second supply line 220.

In this way, the rate of the fluid delivered through the first supply line 210 may be controlled differently from the rate of the fluid delivered through the second supply line 220. The rate of the fluid delivered through the third supply line 230 may be controlled differently from the rate of the fluid supplied through the first supply line 210 and the second supply line 220.

Alternatively, when the diameters of the first supply line 210 and the second supply line 220 are the same as each other, a first aperture ratio of the first valve 211 connected to the first supply line 210 may be different from a second aperture ratio of the second valve 221 connected to the second supply line 220. In this way, the rate of the fluid delivered through the first supply line 210 may be controlled differently from the rate of the fluid delivered through the second supply line 220.

When the diameter of the third supply line 230 is the same as the diameter of the first supply line 210 and the second supply line 220, a third aperture ratio of the third valve 231 connected to the third supply line 230 may be different from aperture ratios of the first valve 211 and the second valve 221. In this way, the rate of the fluid supplied through the third supply line 230 may be controlled differently from the rate of the fluid supplied through the first supply line 210 and the second supply line 220.

Further, in the compressing section S22 of the processing step (S20), the third supply line 230 may be used. As another example, the supply line used in the compressing section S22 of the processing step (S20) may be different from the supply line used in the compressing step (S10). For example, the fluid supplier 200 may further include a separate supply line (i.e., a fourth supply line) used in the compressing section S22 of the processing step (S20).

Figure 7:
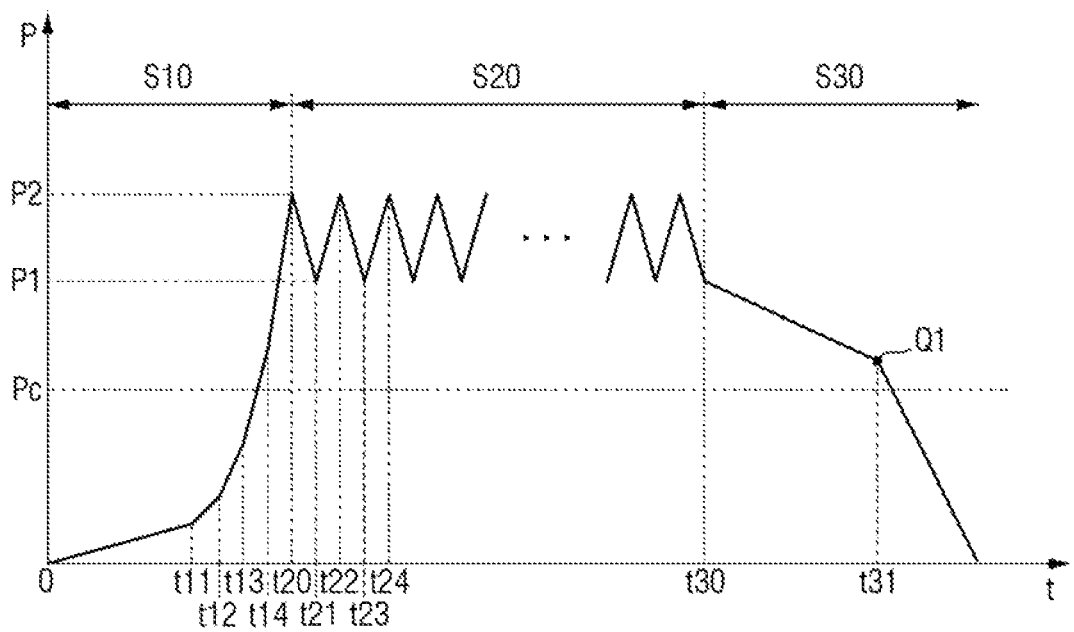
FIG. 7 is a diagram for explaining the method for processing the substrate according to an embodiment.
Figure 8:
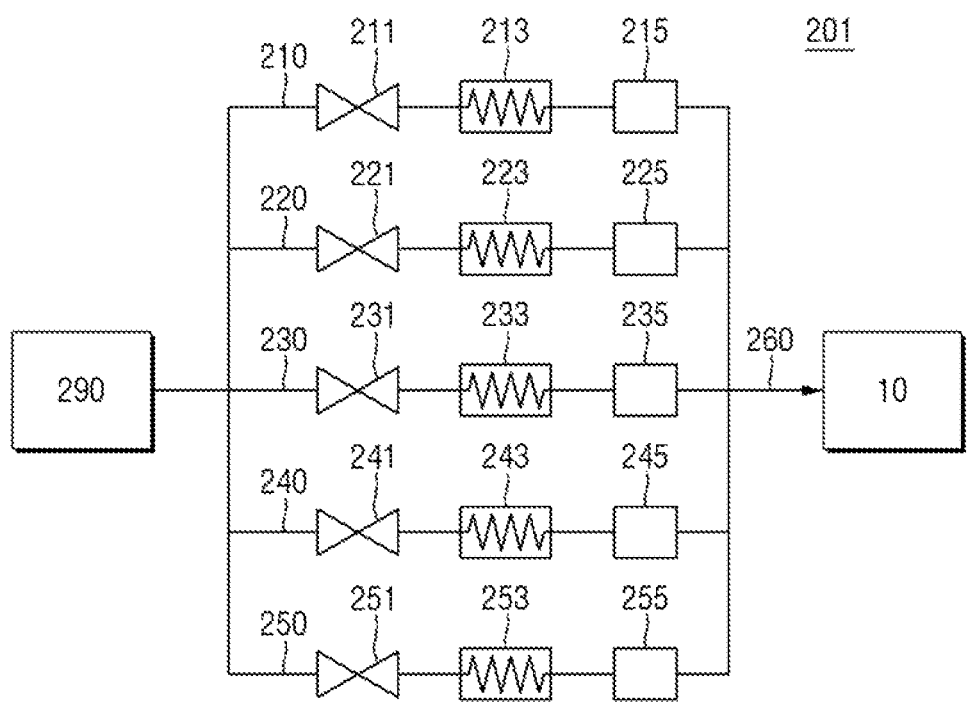
FIG. 8 is a diagram for explaining a fluid supplier used in the method for processing the substrate of FIG. 7.

FIG. 7 is a diagram for explaining the method for processing a substrate according to an embodiment. FIG. 8 is a diagram for explaining a fluid supplier used in the method for processing the substrate of FIG. 7. For convenience of explanation, points different from those described using FIGS. 3 to 6 will be mainly described below.

Referring to FIGS. 7 and 8, in a method for processing the substrate according to another embodiment, the compressing step (S10) includes a first section (0 to t11), a second section (t11 to t12), a third section (t12 to t13), a fourth section (t13 to t14), and a fifth section (t14 to t20).

Referring to FIG. 8, a fluid supplier 201 includes a storage tank 290, a main supply line 260, a plurality of supply lines 210, 220, 230, 240 and 250, a plurality of valves 211, 211, 231, 241 and 251, a plurality of heaters 213, 223, 233, 243 and 253, a plurality of filters 215, 225, 235, 245 and 255, and the like.

A main supply line 260 is connected to the process module 10. Fluid is supplied into the processing space 102 through the main supply line 260 and the supply hole (see 112 of FIG. 2).

The fluid stored in the storage tank 290 may be in the supercritical phase.

The plurality of supply lines 210, 220, 230, 240 and 250 are placed in parallel between the storage tank 290 and the main supply line 260.

The plurality of supply lines 210, 220, 230, 240 and 250 include a first supply line 210, a second supply line 220, a third supply line 230, a fourth supply line 240, and a fifth supply line 250 as shown.

A first valve 211, a first heater 213, and a first filter 215 are placed on the first supply line 210. A second valve 221, a second heater 223 and a second filter 225 are placed on the second supply line 220. A third valve 231, a third heater 233 and a third filter 235 are placed on the third supply line 230. A fourth valve 241, a fourth heater 243 and a fourth filter 245 are placed on the fourth supply line 240. A fifth valve 251, a fifth heater 253 and a fifth filter 255 are placed on the fifth supply line 250.

Each of the valves 211, 221 231, 241 and 251 determines whether the corresponding supply lines 210, 220, 230, 240 and 250 are used. For example, when the valve 241 is turned on, fluid is delivered to the main supply line 260 through the corresponding supply line 240. The plurality of supply lines 210, 220, 230, 240 and 250 may be selectively used in each process (or section) of the method for processing the substrate to be described later. This will be specifically described referring to FIG. 7.

Each of the heaters 213, 223, 233, 243 and 253 controls the temperature of the fluid passing through the corresponding supply lines 210, 220, 230, 240 and 250, and each of the filters 215, 225, 235, 245 and 255 removes impurities of the fluid passing through the corresponding supply lines 210, 220, 230, 240 and 250. The filters 215, 225, 235, 245 and 255 may be installed on the supply lines 210, 220, 230, 240 and 250 as shown. As another example, the filters 215, 225, 235, 245, and 255 may be installed on the main supply line 260, but not on the supply lines 210, 220, 230, 240 and 250.

Referring to FIG. 7 again, the fluid supplier (201 of FIG. 8) supplies the fluid into the processing space 102 at the first rate during the first section (0 to t11), and supplies the fluid into the processing space 102 at a second rate higher than the first rate during the second section (t11 to t12). Further, the fluid is supplied into the processing space 102 at a third rate higher than the second rate during the third section (t12 to t13), the fluid is supplied into the processing space 102 at a fourth rate higher than the third rate during the fourth section (t13 to t14), and the fluid is supplied into the processing space 102 at a fifth rate higher than the fourth rate during the fifth section (t14 to t20).

In the start section of the compressing step (S10) (that is, the first section (0 to t11)), the fluid is supplied at a relatively slow first rate. For example, the first rate may be 0.1 g/s to 0.5 g/s, the second rate may be 0.5 g/s to 2 g/s, the third rate may be 2 g/s to 3.5 g/s, and the fourth rate may be 3.5 g/s to 5 g/s. The fifth rate may be 5/s to 10 g/s.

The progress time of the first section (0 to t11) may be longer than the progress times of each of the second section (t11 to t12), the third section (t12 to t13) or the fourth section (t13 to t14). The progress time of the first section (0 to t11) may be 10 to 30 seconds, and the progress times of the second section (t11 to t12), the third section (t12 to t13) or the fourth section (t13 to t14) may be 3 to 10 seconds.

During the fifth section (t14 to t20), the fluid supplier 201 continues to supply the fluid, and the fluid supplier 201 may increase the pressure of the processing space 102 up to the target pressure P2. The target pressure P2 may be from 80 bar to 150 bar.

Subsequently, when the pressure of the processing space 102 reaches the target pressure P2, the processing step (S20) for processing the substrate W is performed. In the processing step (S20), the plurality of decompressing sections and the plurality of compressing sections are repeated.

Subsequently, after the processing of the substrate W is completed, the decompressing step (S30) for exhausting the fluid inside the process chamber 10 is performed.

After that, the process chamber is opened and the substrate W is carried out from the processing space 102.

Figure 9:
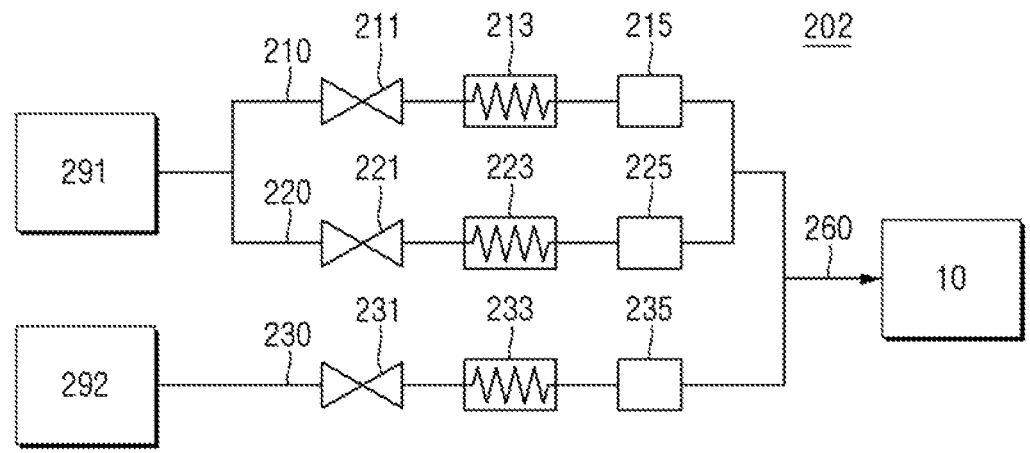
FIG. 9 is a diagram for explaining an example of the fluid supplier which supplies fluid to the process module of FIG. 2.

FIG. 9 is a diagram for explaining an example of the fluid supplier which supplies fluid to the process module of FIG. 2.

Referring to FIG. 9, a fluid supplier 202 includes a first storage tank 291 and a second storage tank 292.

The fluid is stored in the first storage tank 291 at a first pressure. The fluid is stored in the second storage tank 292 at a second pressure higher than the first pressure.

A first supply line 210 and a second supply line 220 are installed in parallel between the first storage tank 291 and the main supply line 260. A third supply line 230 is installed between the second storage tank 292 and the main supply line 260. The third supply line 230 is placed in parallel with the first and second supply lines 210 and 220.

Since the fluid stored in the first storage tank 291 is stored at a lower pressure than that of the second storage tank 292, the fluid provided from the first storage tank 291 is relatively slower than the fluid provided from the second storage tank 292. By utilizing such a point, the fluid provided from the first storage tank 291 passes through the first and second supply lines 210 and 220, and may be used in front sections of the compressing step (S10) (i.e., the first section (0 to t11) and the second section (t11 to t12) of FIG. 6). The fluid provided from the second storage tank 292 passes through the third supply line 230, and is used in a rear section of the compressing step (S10) (i.e., the third section (t12 to t20) of FIG. 6). By utilizing the storage tanks 291 and 292 that store fluids at different pressures from each other in this way, a process window may be expanded.

Figure 10:
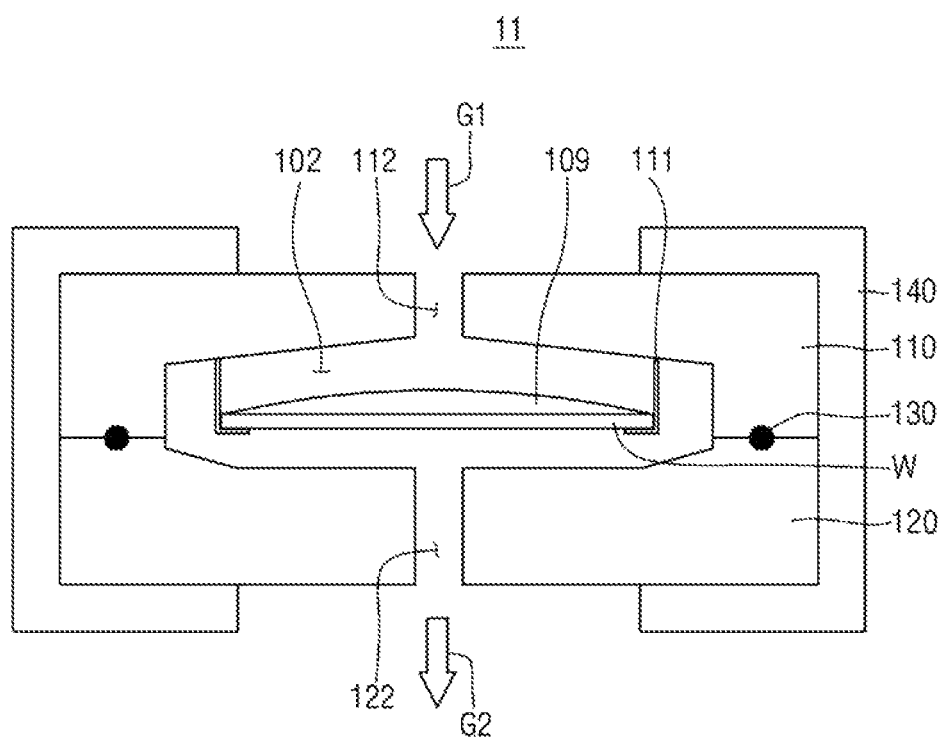
FIG. 10 is a diagram for explaining a structure of the process module of FIG. 1.

FIG. 10 is a diagram for explaining a configuration of the process module (e.g., PC2) of FIG. 1. For convenience of explanation, points different from those described using FIG. 2 will be mainly described.

Referring to FIG. 10, the process module 11 includes an upper housing 110, a lower housing 120, a fixing member 111, a sealing member 130, a clamping member 140, and the like.

A first cavity is formed on the lower side of the upper housing 110, a second cavity is formed on the upper side of the lower housing 120, and the first cavity and the second cavity are connected to each other to define a processing space 102 inside.

The fixing member 111 may be installed inside the first cavity of the upper housing 110. The fixing member 111 may have a shape that is installed above the first cavity of the upper housing 110 and protrudes downward.

The upper housing 110 and/or the lower housing 120 may move up and down. The substrate W is settled on the fixing member 111 of the upper housing 110 in a state in which the upper housing 110 and the lower housing 120 are spaced apart from each other. The developer 109 may remain on the substrate W. After the substrate W is settled, the upper housing 110 descends downward or the lower housing 120 rises upward, and the upper housing 110 and the lower housing 120 are engaged with each other and sealed. The clamping member 140 is then coupled to the upper housing 110 and the lower housing 120. Subsequently, the fluid is supplied to the processing space 102 through the supply hole 112 of the upper housing 110.

Figure 11:
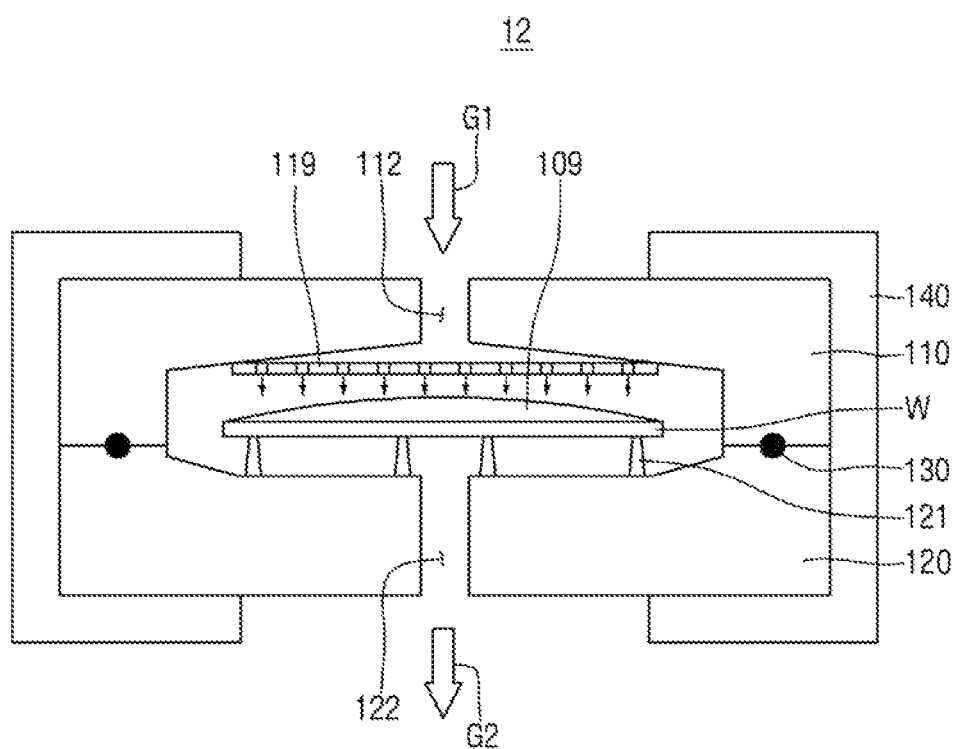
FIG. 11 is a diagram for explaining a structure of the process module of FIG. 1.

FIG. 11 is a diagram for explaining a configuration of the process module (e.g., PC2 of FIG). For convenience of explanation, points different from those described referring to FIG. 2 will be mainly described.

Referring to FIG. 11, the process module 12 includes an upper housing 110, a lower housing 120, a baffle 119, a support pin 121, a sealing member 130, a clamping member 140, and the like.

The baffle 119 is formed on the upper side of the first cavity of the upper housing 110, and the baffle 119 is connected to the supply hole 112. The fluid provided through the supply hole 112 diffuses through the baffle 119. Therefore, the diffused fluid may be spread over the entire surface of the substrate W. Therefore, a pattern leaning phenomenon does not occur near the center of the substrate W, and particles due to drying do not occur.

Figure 12:
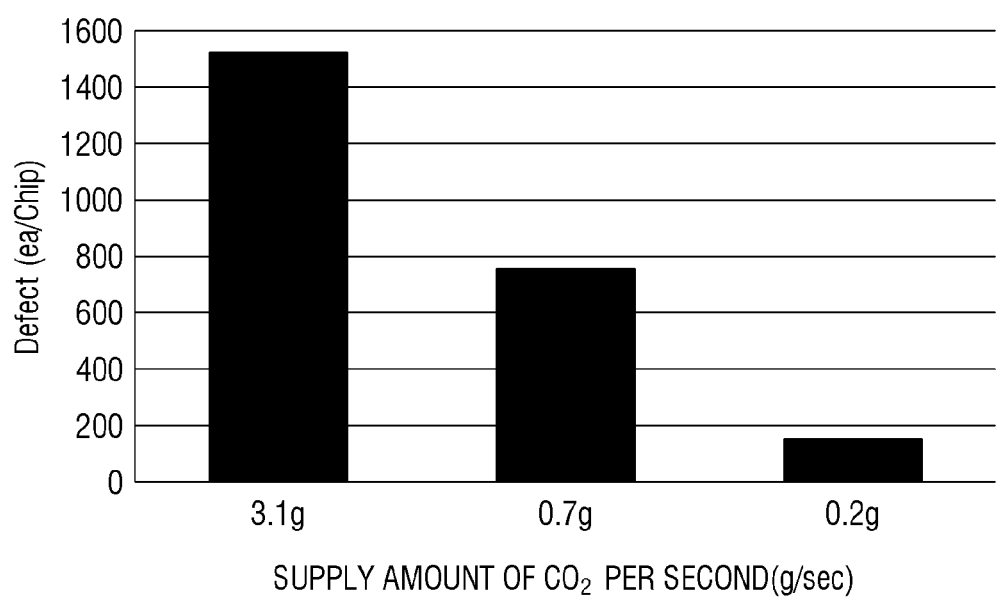
FIG. 12 is a diagram for explaining an effect of the apparatus for processing the substrate according to an embodiment.

FIG. 12 is a diagram for explaining an effect of the apparatus for processing the substrate according to an embodiment.

Referring to FIG. 12, an x-axis represents a supply amount of $CO_2$ per second (g/s) and a y-axis represents the number of defects per chip.

When an initial supply rate in the compressing step (S10) (that is, the fluid supply rate in the first section (0 to t11)) is 3.1 g/s, the number of defects per chip is about 1,500, and when the initial supply rate is 0.7 g/s, the number of defects per chip is about 750. On the other hand, when the initial supply rate in the compressing step (S10) is 0.2 g/s, the number of defects per chip is less than 200. As described above, when the fluid supply rate in the first section (0 to t11) is equal to or smaller than 0.5 g/s, defects per chip can be minimized.

In concluding the detailed description, those skilled in the art will appreciate that many variations and modifications may be made to the preferred embodiments without substantially departing from the principles of the disclosure. Therefore, the disclosed embodiments are used in a generic and descriptive sense only and not for purposes of limitation.

What is claimed is:
1. An apparatus for processing a substrate, the apparatus comprising:
    a process chamber;
    a support which is placed inside the process chamber and is configured to support the substrate;
    a fluid supplier which is configured to supply a fluid into the process chamber; and
    a controller configured to perform a compressing step of the processing of the substrate to bring the fluid into a supercritical phase inside the process chamber,
    wherein the compressing step comprises a continuous first section and second section,
    wherein the fluid supplier comprises a first portion and a second portion,
    wherein the controller is further configured to control the fluid supplier to supply the fluid into the process chamber at a first rate during the first section using the first portion, and supply the fluid into the process chamber at a second rate higher than the first rate during the second section using the second portion, and wherein a progress time of the first section is longer than a progress time of the second section.

2. The apparatus for processing the substrate of claim 1, wherein the first rate is equal to or greater than 0.1 g/s and equal to or smaller than 0.5 g/s.

3. The apparatus for processing the substrate of claim 1, wherein the progress time of the first section is equal to or greater than $1/15$ and equal to or smaller than $1/10$ of a progress time of the compressing step, and the progress time of the second section is equal to or greater than $1/20$ and equal to or smaller than $1/15$ of the progress time of the compressing step.

4. The apparatus for processing the substrate of claim 1, wherein the fluid supplier comprises:
a storage tank which stores the fluid;
a main supply line connected to the process chamber; and
a plurality of supply lines placed in parallel between the storage tank and the main supply line,
wherein the plurality of supply lines comprise a first supply line which is used during the first section, and a second supply line which is used during the second section and is different from the first supply line.

5. The apparatus for processing the substrate of claim 4, wherein a first diameter of the first supply line is different from a second diameter of the second supply line.

6. The apparatus for processing the substrate of claim 4, wherein a first valve is installed on the first supply line, and a second valve is installed on the second supply line, and
wherein a first aperture ratio of the first valve is different from a second aperture ratio of the second valve.

7. The apparatus for processing the substrate of claim 4, wherein the storage tank comprises a first storage tank in which the fluid is stored at a first pressure, and a second storage tank in which the fluid is stored at a second pressure greater than the first pressure,
wherein, during the first section, the controller is configured to deliver the fluid stored in the first storage tank to the main supply line through the first supply line, and
wherein, during the second section, the controller is configured to deliver the fluid stored in the second storage tank to the main supply line through the second supply line.

8. The apparatus for processing the substrate of claim 1, wherein the fluid supplier supplies the fluid toward an upper side of the substrate.

9. The apparatus for processing the substrate of claim 1, wherein the process chamber comprises an upper housing and a lower housing,
wherein the fluid is supplied through a supply hole formed in a central region of the upper housing, and
wherein the fluid is exhausted through an exhaust hole formed in a central region of the lower housing.

10. The apparatus for processing the substrate of claim 9, further comprising:
a baffle which is provided in the upper housing and connected to the supply hole.

11. The apparatus for processing the substrate of claim 1, wherein the compressing step further comprises a third section after the second section,
wherein the fluid supplier comprises a third portion, and
wherein the controller is configured to control the fluid supplier to supply the fluid into the process chamber at a third rate higher than the second rate during the third section.

12. The apparatus for processing the substrate of claim 1, wherein after the compressing step, the controller is configured to repeatedly exhaust a part of the fluid inside the process chamber, and increase an amount of the fluid inside the process chamber by the fluid supplier.

13. The apparatus for processing the substrate of claim 1, wherein after the compressing step, the controller is configured to exhaust the fluid from the process chamber at a first exhaust speed during a first exhaust section, and exhaust the fluid from the process chamber at a second exhaust speed higher than the first exhaust speed during a second exhaust section.

14. The apparatus for processing the substrate of claim 13, wherein the fluid is in a supercritical phase at a start time point of the second exhaust section.

15. The apparatus for processing the substrate of claim 1, wherein a negative tone develop is formed on the substrate, and the controller is configured to take the substrate into the process chamber in a state of being wetted by a developer, and
wherein the fluid comprises carbon dioxide.

16. An apparatus for processing a substrate, the apparatus comprising:
a process chamber;
a support which is placed inside the process chamber and is configured to support the substrate;
a fluid supplier which is configured to supply a fluid toward an upper side of the substrate inside the process chamber; and
a controller configured to perform a compressing step of the processing of the substrate to bring the fluid into a supercritical phase inside the process chamber,
wherein the compressing step comprises a continuous first section, a second section and a third section,
wherein the fluid supplier comprises a first portion, a second portion, and a third portion,
wherein the controller is further configured to control the fluid supplier to supply the fluid into the process chamber at a first rate during the first section using the first portion, supply the fluid into the process chamber at a second rate higher than the first rate during the second section using the second portion, and supply the fluid into the process chamber at a third rate higher than the second rate during the third section using the third portion, and
wherein the first rate is equal to or greater than 0.1 g/s and equal to or smaller than 0.5 g/s.

17. The apparatus for processing the substrate of claim 16, wherein the fluid supplier comprises:
a storage tank which is configured to store the fluid;
a main supply line which is connected to the process chamber; and
a plurality of supply lines which are placed in parallel between the storage tank and the main supply line,
wherein the plurality of supply lines comprises a first supply line used during the first section, a second supply line which is used during the second section and is different from the first supply line, and a third supply line which is used during the third section and is different from the second supply line.

18. The apparatus for processing the substrate of claim 17, wherein a first valve to a third valve having different aperture ratios from each other are installed in the first supply line to the third supply line, respectively.

19. A method for processing a substrate, the method comprising:
a compressing step of supplying a fluid into a process chamber to bring the fluid into a supercritical phase inside the process chamber;

a processing step of processing the substrate inside the process chamber, using the fluid of the supercritical phase; and a decompressing step of exhausting the fluid inside the process chamber, wherein the compressing step comprises a continuous first section and a second section, and comprises supplying the fluid into the process chamber at a first rate during the first section, and supplying the fluid into the process chamber at a second rate higher than the first rate during the second section, and wherein the method further comprises, after the compressing step, repeatedly exhausting a part of the fluid inside the process chamber, and increasing an amount of the fluid inside the process chamber.

\* \* \* \* \*